United States Patent [19]

Moore et al.

[11] Patent Number: 4,551,814

[45] Date of Patent: Nov. 5, 1985

[54] FUNCTIONALLY REDUNDANT LOGIC NETWORK ARCHITECTURES

[75] Inventors: Donald W. Moore; Rick A. Verstraete, both of Los Angeles, Calif.

[73] Assignee: Aerojet-General Corporation, La Jolla, Calif.

[21] Appl. No.: 560,109

[22] Filed: Dec. 12, 1983

[51] Int. Cl.$^4$ ........................................ H03K 19/003
[52] U.S. Cl. .................................... 364/716; 307/465
[58] Field of Search ...................... 364/716; 307/465; 371/11

[56] References Cited

U.S. PATENT DOCUMENTS

| | | | |
|---|---|---|---|
| 3,291,974 | 12/1966 | Even | 364/716 |
| 3,296,424 | 1/1967 | Cohn | 364/716 |
| 3,619,583 | 11/1971 | Arnold | 364/716 |
| 4,380,811 | 4/1983 | Götze et al. | 307/465 |
| 4,418,410 | 11/1983 | Goetze et al. | 371/15 |

Primary Examiner—David H. Malzahn
Attorney, Agent, or Firm—Leonard Tachner

[57] ABSTRACT

A logic gate structure having functionally redundant architecture for enhanced production yields and reliability comprises a plurality of two-input nodes at least some of which may be programmed by control states for changing the logical function of the gate structure. Redundancy is provided by gate structure implementations in which the number of possible control states exceed the number of logic functions expected of the gate structure. Redundancy increases the probability of gate structure operation despite logic faults and renders the gate structure suitable for use in adaptable problem solving machines such as robots and pattern recognition apparatus.

A number of embodiments are disclosed including three and four input variable networks. Some such embodiments include selected architectural simplifications wherein certain nodes in a network are either logically fixed or entirely omitted to reduce the number of control lines.

19 Claims, 24 Drawing Figures

FUNCTIONALLY REDUNDANT LOGIC NETWORK ARCHITECTURES

BACKGROUND OF THE INVENTION

FIELD OF THE INVENTION

This invention relates generally to the field of state machine logic and more specifically, to a modular, logically redundant, multiple input gate in the form of a high speed, low power field programmable logic array in which Boolean logic functions can be programmed by the user despite the presence of component faults, thereby increasing production yields and network reliability.

PRIOR ART

The desirability of an integrated circuit logic device which can realize any logical function of a fixed number of variables is well-known in the art. The capability of a logic device for implementing all possible Boolean functions of its variables is in this description called "completeness". For a gate with N input variables, the number of different Boolean functions is equal to 2 raised to the power 2 to the power N. A gate would therefore be complete if it can be set to any of this set of logic functions. Gates with similar properties have been called universal. However, this term usually means that all the set of such functions can be accommodated with a given set of gates. Thus, universal is more a term on the level of applications, i.e., which or how many functions can be implemented. Completeness is a term about capabilities and the relevant parameter is the number of input variables not the maximum number of functions. Universal logic circuits are discussed in prior art literature including an article entitled "Universal Logic Circuits and Their Modular Realizations" by S. S. Yau and C. K. Tang at pages 297-305 of the 1968 Spring Joint Computer Conference proceedings. The desirability of producing a multipurpose logic circuit for performing all or virtually all discrete logical combinations of a given number of variables, has resulted in a number of relevant prior art patents. For example, U.S. Pat. No. 3,428,903 to Forslund et al discloses a logic block said to be capable of performing 254 out of 256 discrete logical combinations of three variables and an earlier patent to the same inventors, namely, U.S. Pat. No. 3,381,117 discloses a particular logic circuit embodiment which is said to be capable of performing all 256 logic functions of a three input device. The following additional patents are deemed to be relevant in varying degrees to the completeness feature of this invention:

U.S. Pat. No. 3,987,286, Muehldorf
U.S. Pat. No. 4,034,356, Hawley, et al
U.S. Pat. No. 4,053,793, Ernst, et al
U.S. Pat. No. 4,292,548, Suarez, et al
U.S. Pat. No. 4,336,601, Tanaka
U.S. Pat. No. 4,348,737, Cukier, et al A functionally selectable gate is quite simply a logic gate which presents a particular Boolean logic function to the input variables as determined by the user. Accordingly, in addition to the input variable lines and the output line, a plurality of control lines are also required to provide means for selecting a particular function. Usually, a different state of control lines results in a different function being performed. Redundancy means that one or more control states may be omitted without loss of functional capabilities. This implies that certain or all internal states of the gate can be obtained by different settings of the control lines or equivalently, that changing the control lines will not necessarily change the behavior of the gate. For a complete logic architecture, redundancy is implied if there are more than the minimum number of required control lines to select all possible Boolean logic functions for the number of input variables. Thus, if a complete gate has more than two to the power N control lines where N equals the number of input variables, then redundancy is implied. Beyong completeness there is redundancy. However, redundancy does not imply completeness. Indeed an incomplete gate can be redundant by introducing more control lines without new Boolean functions. There is a trade-off between the level of completeness and the level of redundancy. For a given number of control lines one has the option of either a highly complete but non-redundant gate or a less complete but redundant gate. For example, a complete but non-redundant logic gate has exactly one control state for every one of its possible Boolean logic functions. Alternatively, one could design the gate so that the control states come in pairs which specify identical functional states. This would make the logic gate 50% complete but 100% redundant. By the same token, for a given number of external lines, namely, control lines and input variable lines, one has the option of many variables with little control which would render the gate incomplete or many control lines with few variables which would render the gate complete and redundant. There is a whole spectrum of gates between the trivial limits of 0% complete where all input lines are variables and not controls and 100% complete and redundant where all lines are controlled and the gate has no variables.

An important advantage of redundancy is fault tolerance. If one certain state of the control lines does not give the proper behavior due to a fault, it may very well be possible that other control settings for the same Boolean function still accomplish the desired response in the logic gate. The degree to which redundancy renders a logic gate fault tolerant, depends to a great extent upon the nature and location of the fault within the logic gate. However, in general terms the probability that in a redundant logic gate all the equivalents control states are faulty is significantly smaller than is the probability of failure in a non-redundant gate in which a fault is present.

An additional advantageous feature of redundant logic gates relates to their use in adaptive networks. To date, most hardware designs and VLSI systems are based on fixed combinational logic design. However, recent research in robotics, including such fields as pattern recognition, speech understanding, artificial intelligence and expert systems, has uncovered the need for adaptive systems and dynamically reprogrammable architectures. Robotic systems will tend toward problem solving machines that do not require a programmer to do explicit task decomposition and load the solution in the form of a sequential algorithm into the machine. Rather, presented with an abstract goal, the machine will converge on its own to a solution. It will be seen hereinafter that the present invention, in addition to providing a fault tolerant logic gate network, also provides a network which is a basic building block of adaptive systems.

The closest prior art of which the applicants are currently aware is a multiplexer tree described by Yau. However, there are several critical distinctions between the invention herein disclosed and the Yau mux tree. One fundamental difference is that the Yau mux tree is a hierarchial array in which all the control signals are entered at the lowest level of the hierarchy while the data input variables are applied to each level of the hierarchy. However, in the present invention it will be seen that the control signals are applied to each node independently of the other nodes in the array and the data input variables are applied only to the lowermost array layer. As a result, the network of the present invention can be made functionally redundant while the Yau mux tree can not. Consequently, the Yau mux tree is not fault tolerant. Furthermore, the Yau mux tree does not lend itself to a large number of alternative solutions to a problem which seeks the presentation of a specific Boolean logic function to the input data variables. As a result, unlike the present invention, the Yau mux tree is not suitable to adaptive systems wherein in effect, the network of the present invention can search for and find its own solutions.

SUMMARY OF THE INVENTION

The logic device of the present invention performs computational logic functions suitable to concurrent or serial logic machines. It applies to any computer application in which reliability and increased production yield is a requirement. It is also particularly amenable to VLSI architectures and full component testability that solves the well-known VLSI buried logic problem. One illustrative novel test method for fully testing a particular configuration employing the present invention is disclosed and claimed in copending patent application Ser. No. 553,571 filed Nov. 21, 1983 by one of the inventors herein. The invention is logically flexible in that it has features essential to a learning machine and is adaptable to parallel or serial machines thus overcoming the limitations of fixed logic arrays. The invention is field programmable in that it can be reprogrammed during use to suit the user's application while having none of the computational speed or power consumption penalties of conventional field programmable logic arrays. Furthermore, the invention can be manufactured and completely tested as a standard, high volume VLSI product having the advantages of high speed and low power consumption.

More importantly the present invention comprises a logic device which provides a functionally redundant architecture with a substantially enhanced probability of functionality despite the presence of faults, thus rendering the device more reliable in the field and more likely to provide greater production yields. Furthermore, functional redundancy renders the device suitable for use in adaptable problem solving machines where such problems may be numeric such as mathematical calculations as well as non-numeric such as pattern recognition.

In one illustrative embodiment of the present invention, the logic structure comprises a combinational logic device in the form of a complete gate structure. The device is a three-input gate constructed from six two-variable input gates. The device architecture has a regular structure with a hierarchial form. The general purpose quality of the device is derived from the ability of the gate structure to be configurable into all of the possible 256 functions of a three input device. The embodiment is therefore complete in the sense that it can assume any and all possible Boolean functions by a combinational device with up to three inputs. The structure is composed of six two-variable input gates called nodes or atoms. Each input gate is identical and is in itself complete.

At the two-input level, completeness means the ability to recognize all sixteen possible logic functions for two inputs. In this embodiment the multiple logic states that a node or atom may assume are selected by a control structure in the form of a 4-bit control word. When the atom is used as a combinational logic device, a fixed control word establishes the desired function. At this level of control, a simple scheme is available for structuring field programmable logic arrays (FPLA) with qualities of speed and normal power. On the other hand, conventional FPLA design establishes logical options by incorporating into the data path all of the expected logic options and blowing fuses to select specific options. The resultant loading of the data path by the fuse and logic circuitry degrades performance. The atom maintains a parsimonious data path and appends the control structure. Control structure design is independent of the data path quality features. The atom may be arranged in structures that provide for inputs greater than two in other embodiments.

A number of embodiments are disclosed herein comprising three and four input variable networks. In such illustrations of the invention a variety of different configurations are indicated and some of those illustrations include certain preselected architectural simplifications where atoms or nodes in a particular array are either fixed or omitted whereby the total number of control lines is reduced thereby reducing redundancy while maintaining completeness. The potential for use of the present invention is adaptive networks is also discussed herein.

OBJECTS OF THE INVENTION

It is therefore a principal object of the present invention to provide a combinational logic device which has a functionally redundant architecture for rendering the device fault tolerant thereby increasing reliability and increasinfg production yields.

It is an additional object of the present invention to provide a state machine logic device which comprises a hierarchial array of atoms at least some of which may be reconfigured by the logic states of a plurality of control signals to present in a number of different ways a Boolean logic function to the input variables of the network.

It is still an additional object of the present invention to provide a logic gate network having a functionally redundant architecture which renders the network especially suitable for adaptive network systems with non-numeric problem solving capabilities.

BRIEF DESCRIPTION OF THE DRAWINGS

The aforementioned objects and advantages of the present invention as well as additional objects and advantages thereof will be more fully understood hereinafter as a result of a detailed description of preferred embodiments of the invention when taken in conjunction with the following drawings in which.

DETAILED DESCRIPTION OF PREFERRED EMBODIMENTS

Figure 1:
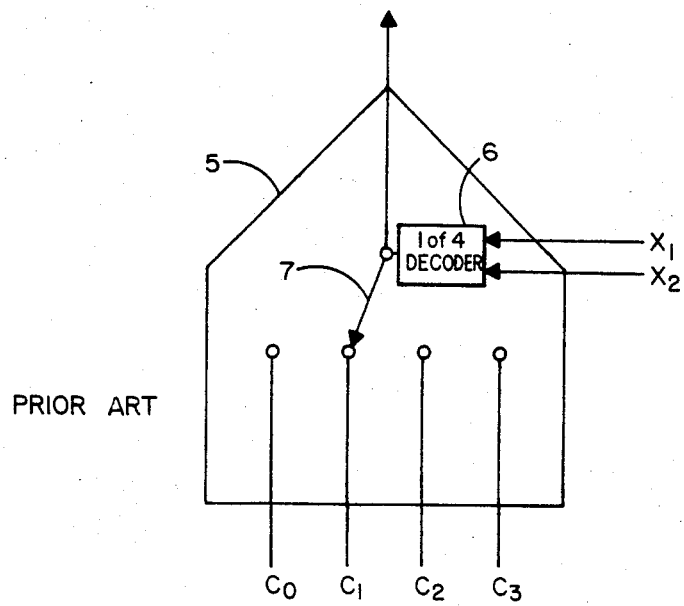
FIG. 1 is a block diagram representation of a two input variable atom of the prior art.
Figure 2:
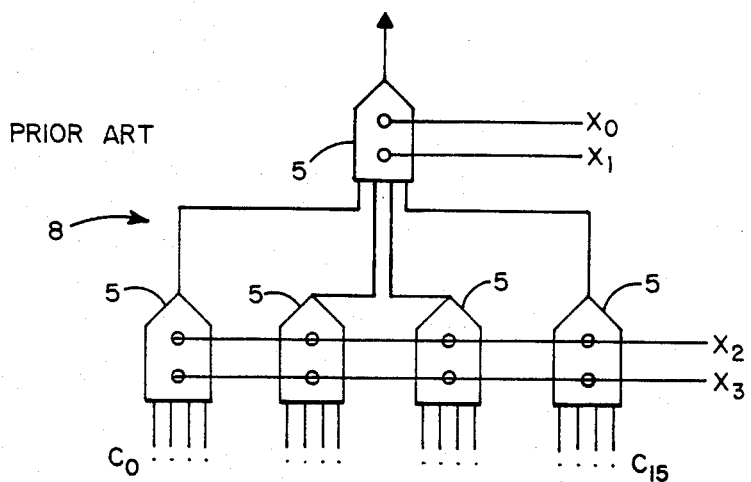
FIG. 2 is a block diagram representation of a four input variable network of the prior art utilizing the prior art atom of FIG. 1.

Reference will first be made to FIGS. 1 and 2 for a brief description of the prior art considered most relevant to the present invention. More specifically, referring to FIG. 1 it will be seen that a prior art atom 5 comprises a one of four decoder 6 and a four position switch 7. The data input variables X1 and X2 are applied to one of four decoder 6 for the control of switch 7 which connects the output of the prior art atom to a selected one of four control inputs C0-C3. Thus, the selection of control signals C0-C3 determines the relationship between the data variable inputs X1 and X2 and the output of the atom. In FIG. 2 a network of such prior art atoms is shown as having the capability for receiving four input variables X0-X3 and sixteen control inputs C0-C15. As seen in FIG. 2, in this configuration the prior art network consists of five atoms 5 comprising four atoms arrayed as a lower layer and adapted for receiving all of the sixteen control lines and two of the four input variables, namely X2 and X3. Each of the lower layer atoms feeds the control input line to a fifth atom 5 which also receives the remaining two input variables X0 and X1. It will be seen hereinafter that there are a number of differences between the prior art of FIGS. 1 and 2 and the present invention hereinafter disclosed. More specifically, it will be seen that the prior art network is hierarchial in data input while the network of the present invention is hierarchial in control input. Furthermore, of particular importance is the fact that the network of FIG. 2 is non-redundant. There are precisely the number of control lines and control circuit paths required to select all the possible Boolean logic functions to render the prior art network of FIG. 2 complete for four input variables. As a result, the prior art network of FIG. 2 lacks the fault tolerant and adaptability features of the present invention as will be hereinafter more fully understood.

Figure 3:
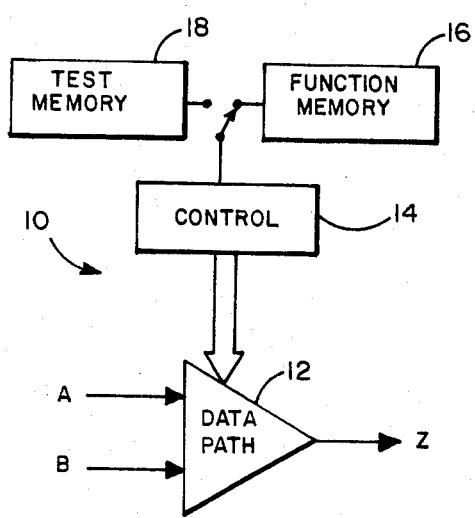
FIG. 3 is a block diagram of a unitary node or atom of the invention configured for test or function as selected by a user.

FIG. 3 is a basic building block or atom 10 of the logic network of the invention. It is a six input device comprising two variable data inputs and four control line inputs. Consequently, it is a complete logic device, meaning that it has the maximum computing power for two input variables. In the symbolic block diagram of FIG. 3 atom 10 comprises a data path 12, a control apparatus 14, a function memory 16 and a test memory 18. Input variables A and B are applied to data path 12 which in turn produces an output Z. The output Z is a Boolean function of the input variables A and B determined in accordance with the output of control apparatus 14. Control apparatus 14 provides four control lines carrying a selected combination of four binary signals which determine the Boolean function of data path with respect to the input variables A and B. The provision of four such control lines from control apparatus 14 permits the application of sixteen binary combinations to data path 12 thereby allowing data path 12 to assume all possible sixteen Boolean functions for two input variables. These sixteen Boolean functions are listed in and represented by the Karnaugh Map shown in Table 1.

TABLE I

| BOOLEAN EXPRESSION | KARNAUGH MAP | CONTROL CODE | | | |
|---|---|---|---|---|---|
| | | C3 | C2 | C1 | C0 |
| 0 | | 0 | 0 | 0 | 0 |
| X1 · X2 | | 0 | 0 | 0 | 1 |
| $\overline{X1}$ · X2 | | 0 | 0 | 1 | 0 |
| X2 | | 0 | 0 | 1 | 1 |
| $\overline{X1}$ · $\overline{X2}$ | | 0 | 1 | 0 | 0 |
| X1 · X2 + $\overline{X1}$ · $\overline{X2}$ | | 0 | 1 | 0 | 1 |
| $\overline{X1}$ | | 0 | 1 | 1 | 0 |
| $\overline{X}$ + X2 | | 0 | 1 | 1 | 1 |
| X1 · $\overline{X2}$ | | 1 | 0 | 0 | 0 |
| X1 | | 1 | 0 | 0 | 1 |
| X1 · $\overline{X2}$ + $\overline{X1}$ · X2 | | 1 | 0 | 1 | 0 |
| X1 + X2 | | 1 | 0 | 1 | 1 |
| $\overline{X2}$ | | 1 | 1 | 0 | 0 |
| X1 + $\overline{X2}$ | | 1 | 1 | 0 | 1 |
| $\overline{X1}$ + $\overline{X2}$ | | 1 | 1 | 1 | 0 |
| 1 | | 1 | 1 | 1 | 1 |

As seen in FIG. 3 the actual control apparatus output may be controlled by either a function memory 16 or a test memory 18. Typically the function memory 16 places control apparatus 14 in a suitable control mode for providing data path 12 with a selected Boolean function for input variables A and B. However, function memory 16 may be selectively re-programmed as required to change the output of control apparatus 14 in accordance with an alternative selection for the Boolean function of data path 12. On the other hand, test memory 18 would typically be provided with capability for cycling control apparatus 14 through all possible control signal combinations in a sequential fashion for the purpose of generating all Boolean functions for data path 12 during a test of the atom 10.

Figure 4:
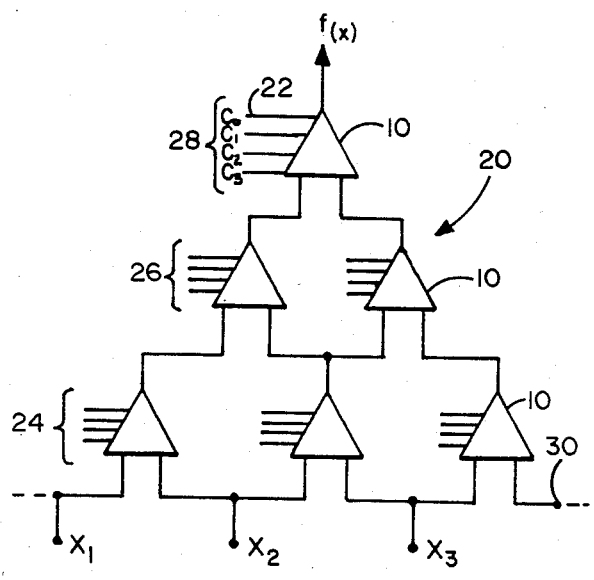
FIG. 4 is a schematic block diagram of a three variable gate structure embodiment of the invention utilizing six of the atoms or nodes of FIG. 3.

Referring to FIG. 4 there is shown therein an illustrative general purpose gate 20 which is a combinational logic device in the form of a complete gate structure. The device is a three-variable input gate structured from six two-variable input gates or atoms 10. The device architecture has a regular structure with a hierarchial form. The general purpose quality of the device derives from the ability of the gate structure to be configurable into all of the possible 256 truth-table values of a three input device. The gate structure 20 is thus "complete" in the sense that it can assume any and all possible Boolean functions as a combinational device with three inputs. As previously discussed in conjunction with FIG. 3, each two-variable input gate or atom 10 is identical and is in itself complete. The bottom tier 24 of atoms 10 comprises three such atoms which are adapted to receive input variables X1, X2 and X3 and provide connection to he next highest tier 26 of two atoms 10 which is in turn connected to a highest tier 28 of a single atom 10. The output signal of single atom 10 comprising tier 28 is f(x), a Boolean function of three input variables X1, X2 and X3. It is to be noted that the right-most input line 30 of the right-most atom 10 of tier 24 is connected to the left-most input line of the left-most atom 10 of that tier to provide for three input variables. It is also to be noted that each atom 10 includes provision for four control lines C0, C1, C2 and C3. Each such set of control lines is connected to a source of control code signals. This feature is discussed hereinafter in conjunction with FIG. 5.

Reference will now be made to FIGS. 5–8 for a more detailed description of an actual integrated circuit implementation of one illustrative embodiment of the present invention. More specifically, referring first to FIG. 5 it will be seen that the actual implementation of each atom or two-variable input gate structure of the present invention comprises a logical unit 40, a decode programmable logic array (PLA) 42, a static shift register (SSR) 44, and a two phase clock generator 46.

Figure 6:
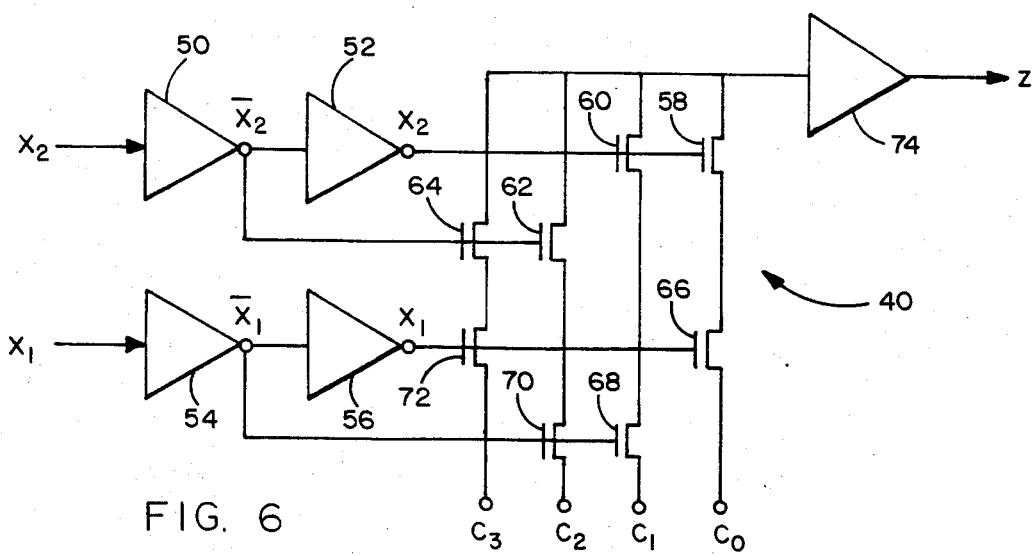
FIG. 6 is a schematic diagram of a specific gate structure of a node or atom of the present invention shown in accordance with a preferred embodiment that has been reduced to practice.

Logic unit 40 is shown in detail in FIG. 6. As seen in FIG. 6 the logic unit 40 is driven by inverting super buffers 50, 52, 54 and 56 and a non-inverting super buffer 74 to ensure maximum speed in the input/output logic circuit. Each of the inverting input buffers drives the gate of each of two field effect transistors (FET). Control signals C-C3 provide the source voltages and the drains are tied either serially or directly to common input/output super buffer 74. In this manner the logic condition of the control signals C0–C3 determines which one of the possible Boolean functions of input variables X1 and X2 will produce the Z output. Thus, for example, if only C0 were in a logical one condition and the remaining control signals were all at logical zero conditions, Z would attain a logic one state only if both X1 and X2 input variables were at a logical one state. Therefore, in this condition, logic unit 40 would act as an AND gate. On the other hand, if control signals C0, C1 and C3 were in a logic one condition and only C2 were in a logic zero condition, the Z output would be in a logic one condition if either X1 or X2 or both were in a logic one condition. Therefore, in this mode of control, logic unit 40 would behave as an OR gate. Whenever the control signals C0–C3 are fixed, the logic unit is the only portion of the atom implicated in signal handling.

Control signals for the logic unit 40 are derived from a static shift register 44 and a programmed logic array 42. This combination provides a means to change the control signal and to remember the last signals, thus comprising a form of memory. SSR 44 comprises up to eight register segments and so may be shifted sequentially into eight states by a clock signal CLK. The eight states are decoded by the PLA 42 into sixteen unique signals for sixteen clock transitions by a NAND portion of the PLA. A NOR portion of the PLA 42 converts the sixteen signals out of the SSR 44 into as many four-bit binary words that act as the control signals for the logic unit. SSR 44 is a conventional device comprising sixteen inverting super buffers arranged in a ring with the output of the last stage being inverted to be looped back to the SSR input. Each inverter drives an input to the PLA NAND section. In this manner, the SSR provides the needed complements to the eight inverter segments. The pass-transistors that operate the register of SSR 44 are clustered at the input to each segment. In this way, the speed of the circuit is improved and the hazard of faulty logic due to capacitive voltage is minimized.

The PLA is sparsely populated with transistors; i.e., only two per inverter signal (32 total). This low population permits distribution of the transistors toward the drive parts and reduced PLA capacitance. A non-overlapping clock utilizes the capacity of two distribution buses CLOCK and NON-CLOCK to slow clock transitions in proportion to the chip distributed capacity ensuring that all the register gates are at correct potentials during shifting. This precaution is included to avoid "racing" in the SSR. The clock generation circuit is a familiar two NOR gate five inverter design. Super buffers are used to drive the clock buses, provide somewhat equal rise and fall times and also facilitate a clock slow-down function.

Figure 5:
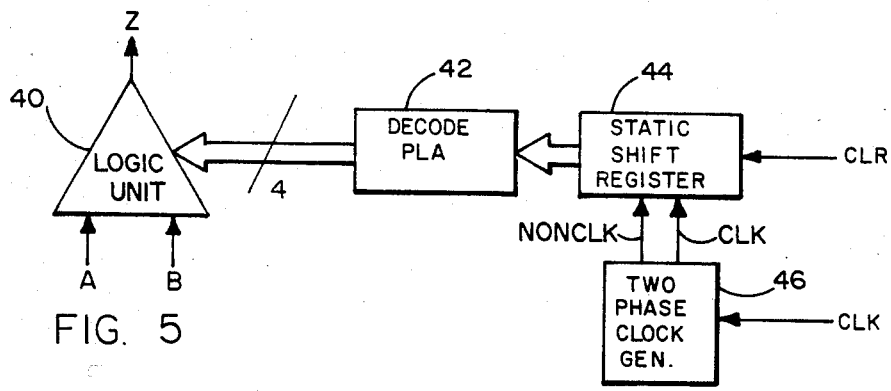
FIG. 5 is a block diagram of a node or atom of the present invention configured specifically in accordance with the preferred embodiment that has been reduced to practice.
Figure 7:
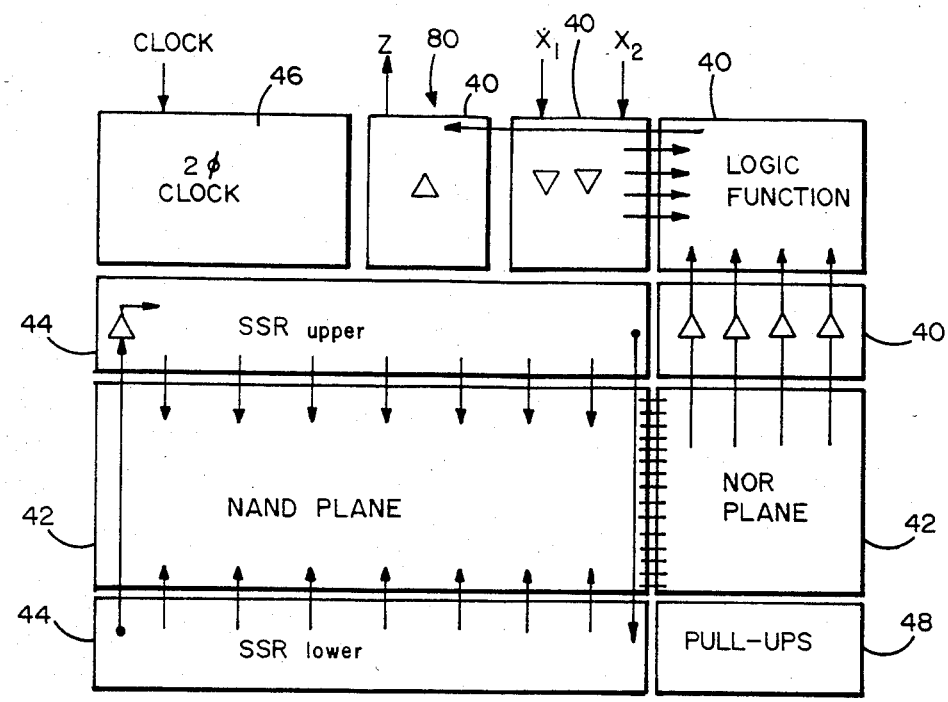
FIGS. 7 and 8 are floor plan layout drawings respectively of an atom or node of the invention and of an entire chip incorporating dual sets of six such atoms.
Figure 8:
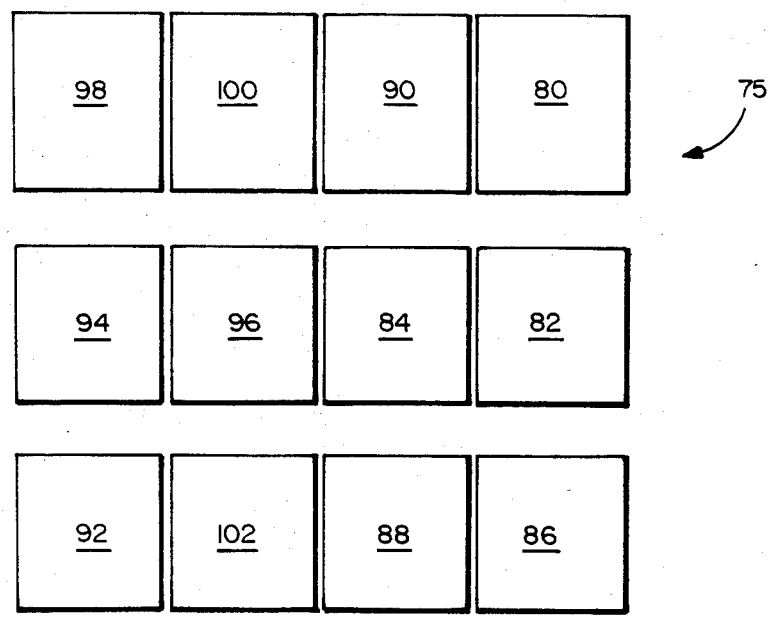

Floor plan drawings of the replicated two input atom 10 incorporating the SSR/PLA configuration of FIG. 5 and of an entire chip incorporating two complete gate networks 20 of FIG. 4, are shown respectively in FIGS. 7 and 8. The layout of gate 10 is determined largely the PLA shape. PLA size is determined by the spacing of the super buffers and switching transistor networks that drive the PLA. The design of the chip floor plan is based upon the replication and interconnection of the basic two input gates in groups of six with two such groups being incorporated on a single chip. The resultant chip size is approximately 4×5 mils including 36 pads. As seen in FIG. 7 the reference numerals applied to the layout of the atom or two input logic gate indicate the correspondence between the floor plan location and the functional block discussed previously in conjunction with FIG. 5. The only portion of the floor plan of FIG. 7 not previously identified comprises a plurality of pull-up resistors 48 shown in the lower right-hand of that figure. Thus, the floor plan of the two input logic gate generally identified by reference numeral 80 as shown in FIG. 7, comprises four portions which make up the logic unit 40, two portions including a NAND plane and a NOR plane which make up PLA 42, two portions including an upper SSR portion and a lower SSR portion which make up static shift register 44 and a single portion which comprises the two phase clock 46 along with the previously mentioned pull-up resistors portion 48.

An entire network of gates is shown in FIG. 8 in the layout of a chip 75 wherein the two input gate portion 80 is located in the upper right-hand corner of the floor plan of the entire chip. Two input gate 80 forms the upper-most heirarchial chip of a first group comprising additional atoms 82, 84, 86, 88 and 90, which, in combination, provide a complete three-variable input logic gate structure as shown in FIG. 4. The chip 75 also comprises a second such three-variable input gate structure comprising atoms 92, 94, 96, 98, 100 and 102 with atom 92 forming the upper-most level of the hierarchial structure of that group.

Functional redundancy of a logic network may be defined as the number of control stated divided by the number of functions. For complete logic networks, that is for logic networks which are capable of presenting all possible Boolean logic functions for the number of input variables, this ratio may be anywhere in the range of 1 to infinity. In the case of the complete network of FIG. 4 which has a total of 24 control lines, the number of control states is 2 to the power 24 and the number of functions for the three input varibles is 256 or 2 to 8th. Consequently, the redundancy ratio is 2 to the power 16 thereby indicating that the network of FIG. 4 is an extremely redundant configuration. Table II provides a sample listing of the number of possible implementations for 30 of the 256 Boolean functions possible in the network of FIG. 4. As seen in Table I, except for the two trivial cases of a fixed zero on one output irrespective of the input, the number of possible implementations for various truth table functions of the network of FIG. 4 extends into the region between 100,000 and 200,000 such implementations for many of the functions and reduces to a minimum of 2,496 implementations for the least implementation function. Those having skill in the art to which the present invention pertains will in fact perceive that the minimum possible number of implementation schemes for any function in the entire table of 256 Boolean logic functions for the network of FIG. 4 is 2,496.

TABLE II

| THE REDUNDANCY OF THE 3-INPUT NETWORK | | |
|---|---|---|
| FUNCTION # | TRUTH TABLE OF FUNCTION | NUMBER OF IMPLEMENTATIONS |
| 0 | : 00000000 | 3261376 |
| 1 | : 00000001 | 128192 |
| 2 | : 00000010 | 128192 |
| 3 | : 00000011 | 113600 |
| 4 | : 00000100 | 128192 |
| 5 | : 00000101 | 113600 |
| 6 | : 00000110 | 19776 |
| 7 | : 00000111 | 22720 |
| 8 | : 00001000 | 128192 |
| 9 | : 00001001 | 19776 |
| 10 | : 00001010 | 113600 |
| 11 | : 00001011 | 22720 |
| 12 | : 00001100 | 113600 |
| 13 | : 00001101 | 22720 |
| 14 | : 00001110 | 22720 |
| 15 | : 00001111 | 127168 |
| 16 | : 00010000 | 128192 |
| 17 | : 00010001 | 188608 |
| 18 | : 00010010 | 22528 |
| 19 | : 00010011 | 20608 |
| 20 | : 00010100 | 22528 |
| 21 | : 00010101 | 20608 |
| 22 | : 00010110 | 2496 |
| 23 | : 00010111 | 2624 |
| 250 | : 11111010 | 113600 |
| 251 | : 11111011 | 128192 |
| 252 | : 11111100 | 113600 |
| 253 | : 11111101 | 128192 |
| 254 | : 11111110 | 128192 |
| 255 | : 11111111 | 3261376 |

Figure 9:
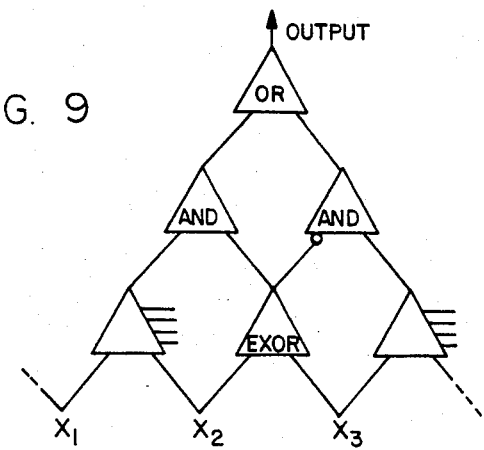
FIGS. 9 and 10 are alternative representations of a three input non-redundant structure of the present invention.

As previously indicated and as will be discussed hereinafter in more detail, redundancy renders the logic network fault tolerant making it more reliable and increasing production yields. However, such redundancy also provides an additional advantage which permits the designer to simplify the network while still retaining the quality of logic completeness. Simplification of logically redundant and complete networks which permit retention of the quality of completeness, may be accomplished in two ways. One way is to fix the logic configuration of some nodes or atoms within an array while retaining some measure of the control of the variation of the remaining nodes. The other way of simplification is to reduce the number of nodes in a particular array and thus reduce the number of control lines and control states. By way of example, FIGS. 9 and 10 both represent a simplified configuration of a three input structure of the present invention wherein redundancy has been reduced to one while the completeness quality of the network has been retained. As seen in FIG. 9, this is accomplished by fixing the uppermost atom of the array in an OR configuration and fixing the two atoms of the second level of the array in an AND and AND NOT configuration, respectively. It is to be noted for purposes of discussion herein that an AND NOT nomenclature refers to an AND gate having an inverter on one input. In some figures, an AND gate having an inverter (circle) on one leg is used as an alternative nomenclature. Finally, the middle node of the bottom level of the array has been fixed in an exclusive OR configuration and the remaining outside nodes of the bottom layer retain full control capability wherein four control lines and thus 2 to the power 4 control states can still be provided. It will be observed that the completeness of the network has been retained even though completeness of only two of the atoms has been preserved with the remaining atoms having their functional capability reduced to one chosen function. This simplified non-redundant but complete configuration of the six atom array for three input variables of the present invention is illustrated in a form of schematic shorthand notation in FIG. 10 wherein the fixed atoms or nodes of the array are represented by the diamond shape cross hatched portion of the network and the total number of control lines is represented by the numeral containing arrow on the right side of the network.

The simplification of redundant logic networks of the present invention can also provide networks which are capable of logical completeness for more than three input variables. For example, using the graphical nomenclature of FIG. 10, a four input simplified complete structure utilizing the present invention is illustrated in FIG. 11. As seen in FIG. 11 the four input structure employs a air of simplified three input structures as well as the fixed node portion of a third three input network with the variable atoms from the third network omitted and only the variable atoms of the simplified complete networks being retained with a total of sixteen control lines. A schematically more complete representation of the four input logic network structure of FIG. 11 is shown in FIG. 12 wherein it is seen that the total structure comprises only four complete two variable input atoms with the remaining atoms being fixed at preselected Boolean functions and no longer requiring control input lines.

Figure 10:
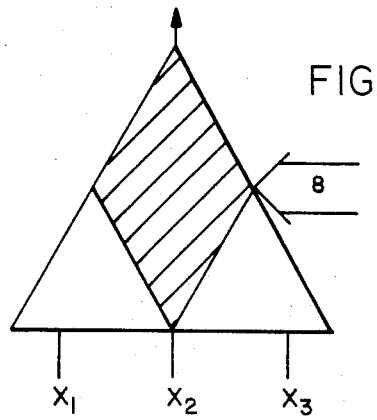
Figure 11:
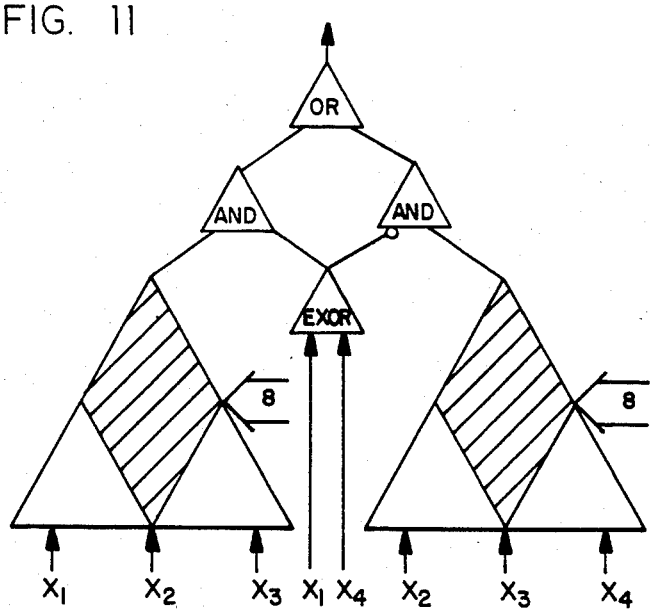
FIGS. 11 and 12 are alternative representations of a four input non-redundant structure of the present invention.
Figure 12:
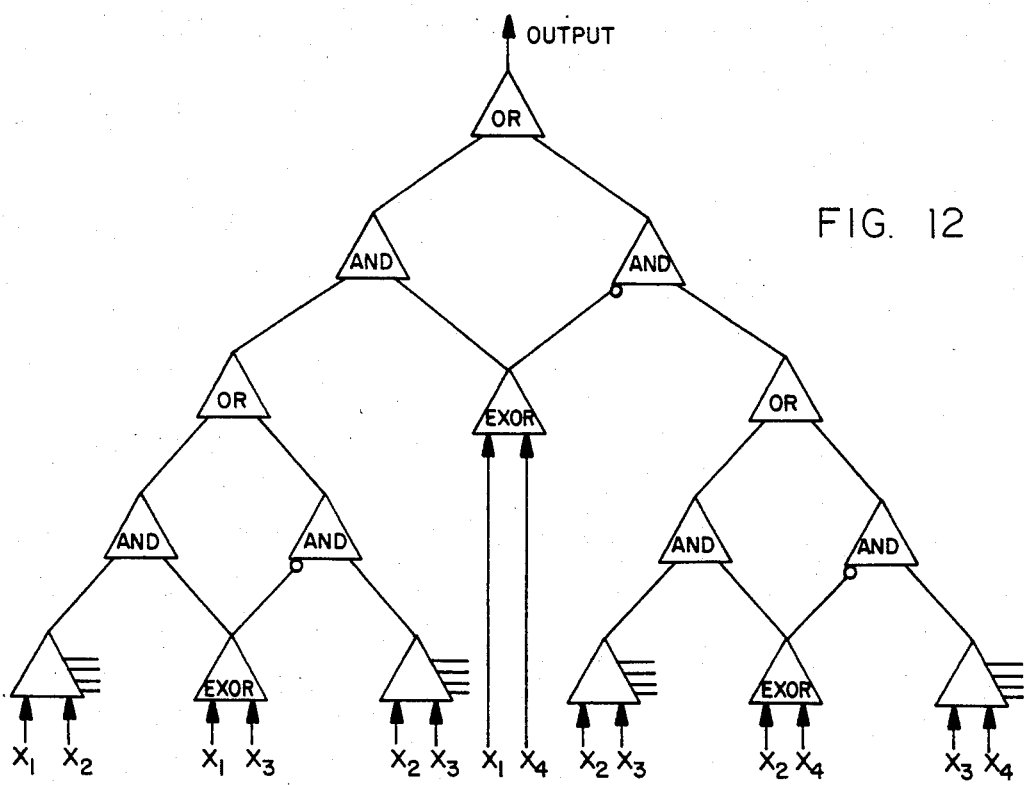
Figure 13:
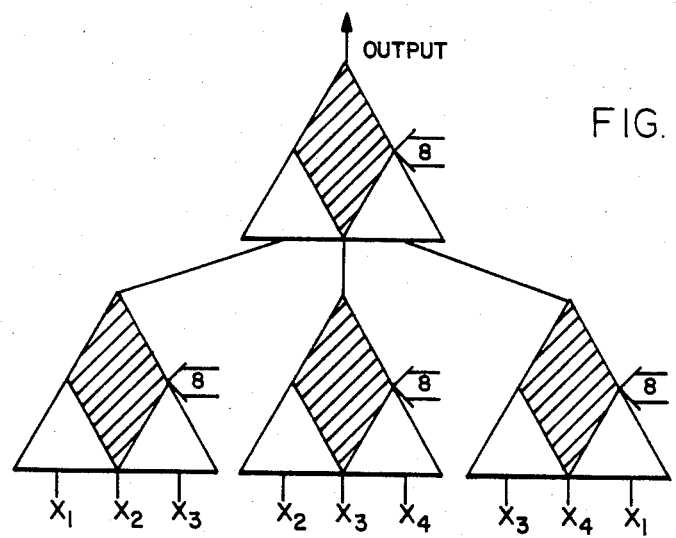
FIGS. 13 and 14 are drawing representations of two different four input redundant logic networks of the present invention in accordance with alternative optional embodiments thereof.
Figure 14:
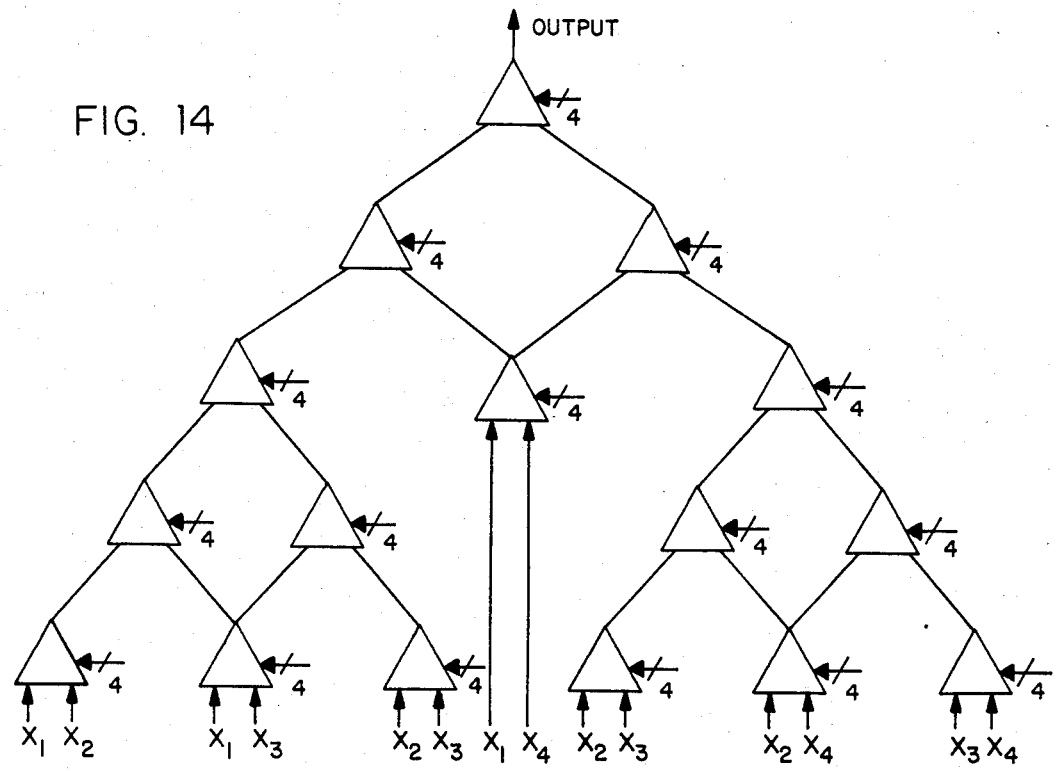

In the three input simplified configuration of FIGS. 9 and 10 and the four input simplified configuration of FIGS. 11 and 12, the simplification process is made at the expense of redundancy and as a result, both networks remain logically complete but become non-redundant with simplification. However, because of the vast redundancy of the basic network of FIG. 4, it is entirely possible to simplify the various building block structures of the present invention at the expense of redundancy but without losing redundancy entirely. The four input network structure configurations of FIGS. 13 and 14 are illustrative of this feature. Thus for example, in FIG. 13 the four input structure is achieved by combining four of the diamond simplifications of FIG. 10 as shown in FIG. 13. Thus the network configuration of FIG. 13 comprises four six node arrays in which in each array the four diamond inclusive atoms are fixed and the two diamond exclusive atoms remain variable with four control input lines. Clearly the configuration of FIG. 13 is complete and redundant as well. The number of possible Boolean logic functions is 2 to the 16th power or 65,536 while the number of control states is 2 to the 32nd power clearly rendering the network of FIG. 13 highly redundant. Thus, it will be seen that the network of FIG. 13 comprises a four input structure in which simplification of the basic logic network of FIG. 4 has been utilized to substantially reduce the complexity of the implementation of the structure but nevertheless the structure remains highly redundant and thus to a degree offers the advantages of fault tolerance and adaptability.

An alternative form of simplification for a four input redundant logic structure is shown in FIG. 14. The structure of FIG. 14 utilizes the previously mentioned simplification alternative, namely, reducing the number of atoms without fixing any of the remaining atoms. It is seen that the structure comprises three of the networks of FIG. 4, however, the two outermost lower tier atoms of the upper tier network can be omitted. In this configuration it is seen that the level of redundancy is even greater than the configuration of the four input structure of FIG. 13. More specifically, it is seen that in the configuration of the four input structure of FIG. 14 there are still 2 to the 64 control states using even a higher level of redundancy and therefore increased probability of fault tolerance and a greater level of adaptability.

Figure 15:
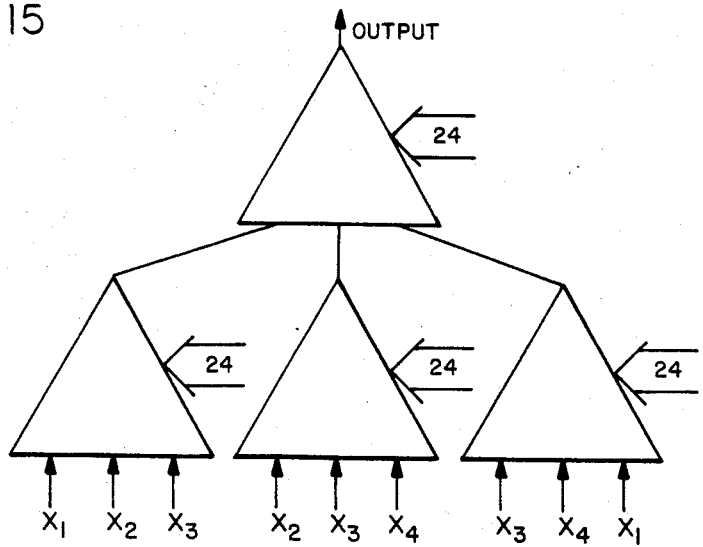
FIGS. 15 and 16 are two alternative representations of an additional four input redundant logic network of the present invention in accordance with an additional embodiment thereof.
Figure 16:
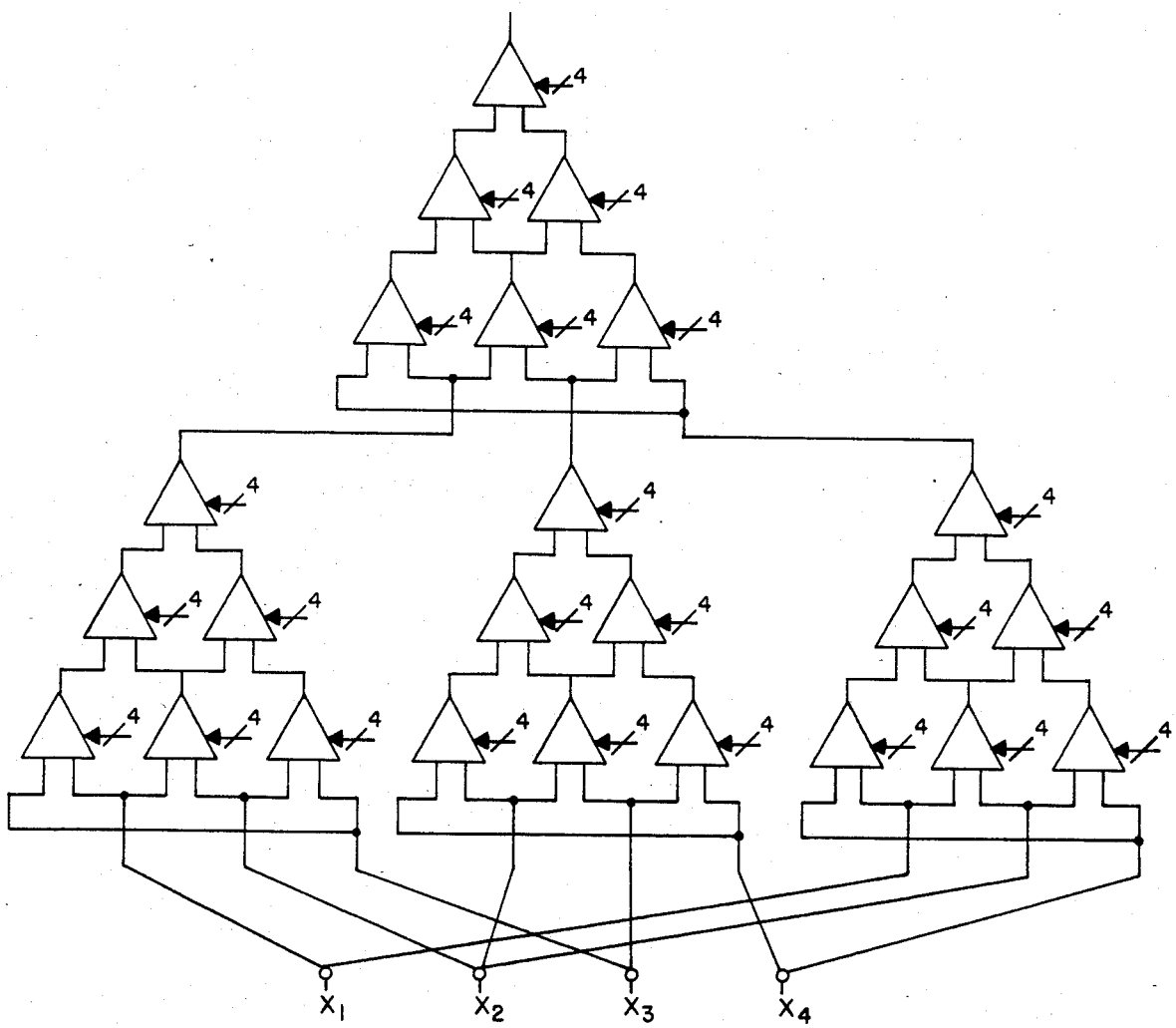

In FIGS. 15 and 16 a four input network structure of the utmost redundancy utilizing the basic network of FIG. 4 is shown. In the configuration of FIGS. 15 and 16 no simplification is provided and implementation for a complete four input network structure is carried out for maximum redundancy using a non-redundant but complete two input atom. Thus, it is seen that the present invention provides a logic network in which multidata input configurations may be provided along with a host of various implementations where the level of redundancy may be selected to offer completeness with maximum simplification or completeness with maximum two-layer network redundancy or any combination between those limits of completeness.

Figure 17:
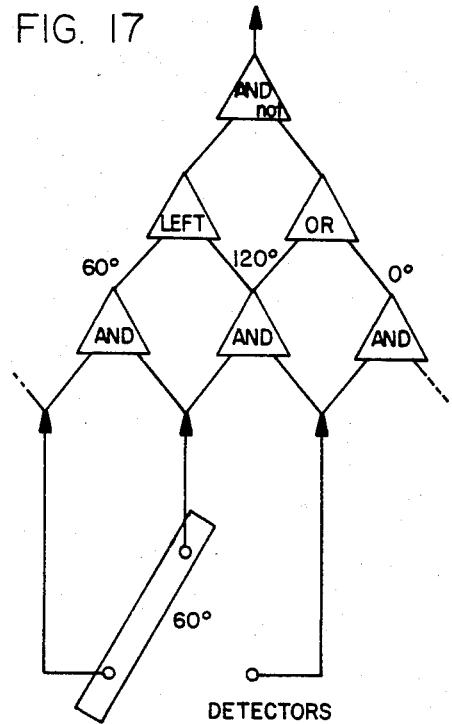
FIGS. 17-23 comprise logic network diagrams of the invention which illustrate the problem solving and fault tolerance capabilities of the invention.

Reference will now be made to FIGS. 17–24 which provide simple illustrative examples of the use of the redundancy of the present invention and the resultant advantages relating to problem solving and fault tolerance. More specifically, referring first to FIG. 17 it will be seen that a three input network of the present invention is provided with a plurality of detectors, one connected to each of the input variable lines to the network. For purposes of clarity, control line structure is not shown in FIG. 17 or in the remaining figures. However, it is to be understood that the control states of each of the atoms of the respective networks have already been selectively sequenced to achieve particular logic functions indicated in order to accomplish a given task. In the case of FIG. 17, the task is related to pattern recognition and more specifically, involves detection of a single line oriented at 60 degrees as shown in the figure. The detectors connected to the left-most AND gate of the lower layer of tier of the array of FIG. 17 would generate a logical one while the remaining detector would remain inactive and generate a logical zero. The task assigned also required that the output of the network be a logical one only when the 60 degree line is present and that it be a logical zero when any other line is present whether or not a 60 degree line is present. In the logical nomenclature used in FIG. 17 the AND nodes and OR node operate in a conventional AND and OR gate configuration respectively. The node labeled left is controlled to be transparent to the left input and to ignore the right input and the uppermost node labeled AND NOT is controlled to perform as a conventional AND gate but with an inverter on the right input. Those having skill in the digital logic art will recognize that a network having a particular combination of functional atoms shown in FIG. 17 will in fact perform the task or one line detection illustrated in that figure.

Figure 18:
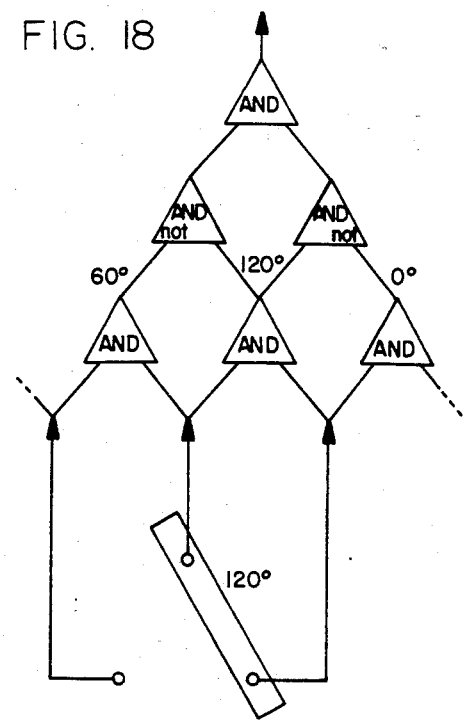

The task of the network shown in FIG. 18 is to detect the 120 degree line illustrated in that figure and only that line. The absence of that line or the presence of additional lines should produce a zero logic output while the presence of the 120 degree line and only that line should produce a logical one output. As seen in FIG. 18 the network has been reprogrammed to accomplish this task. The lower layer of atoms remains the same, namely, three AND gates. However, the second layer of atoms has been altered so that the left atom has been changed to an AND gate with an inverter on its left leg and the right atom has been changed to an AND gate with an inverter on its right leg. In addition, the uppermost atom on the top layer of the network has been changed to an AND gate without inverters. Those having skill in the relevant art will recognize that the particular selection of atom function does indeed accomplish the task assigned to the network of FIG. 18.

Figure 19:
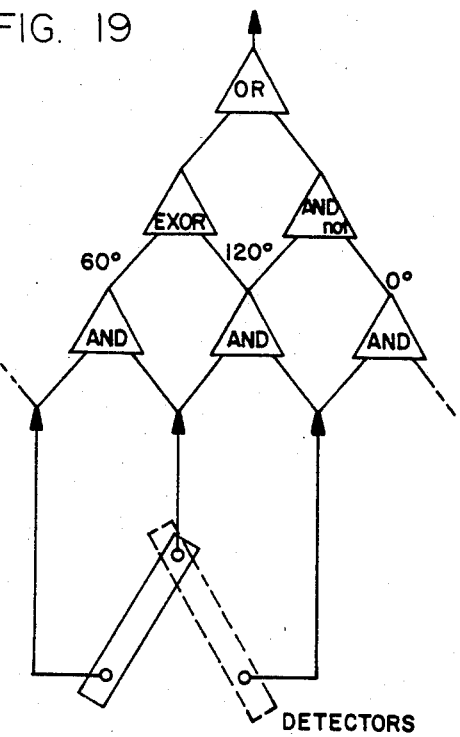
Figure 20:
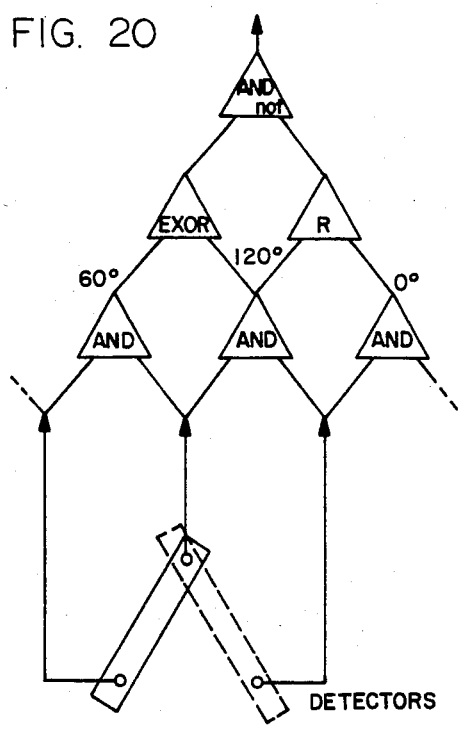
Figure 21:
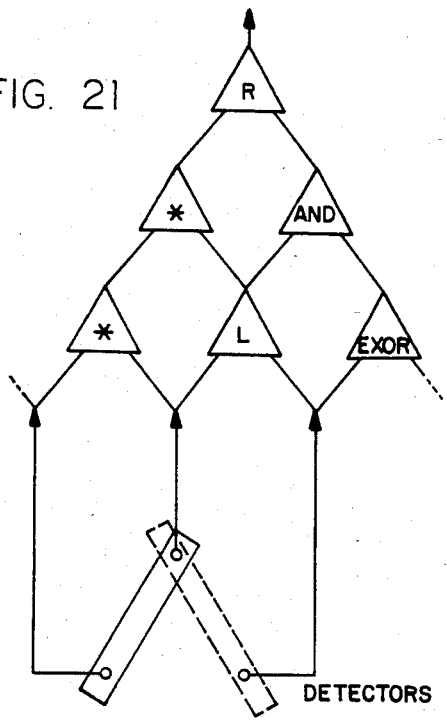
Figure 22:
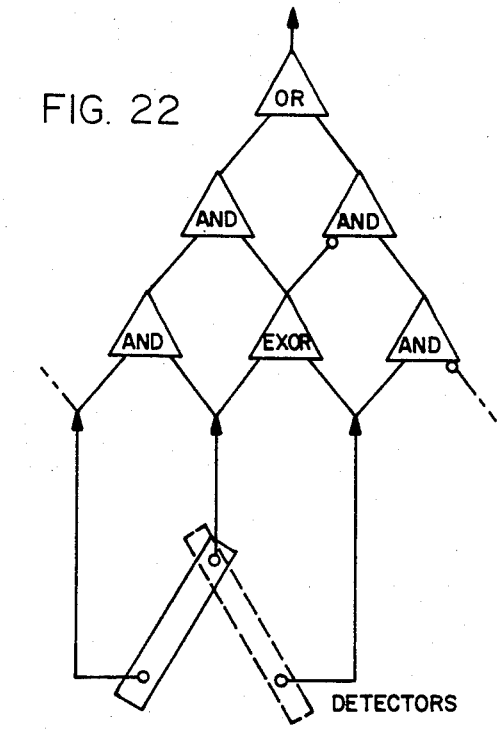

The task assigned to the networks of FIGS. 19–22 is that of detecting two lines, namely, the 60 degree line or the 120 degree line. The network should generate a logical one at its output only if either one of these lines is present and it should generate a zero at its logical output if both lines are present, if both lines are absent or if the third line, the zero degree line, is present. Those having skill in the relevant art will recognize that each of the networks of FIGS. 19–22 provides a different but acceptable solution to the task at hand and numerous other acceptable solutions will likely occur. This ability of the network of the present invention to provide multiple solutions to the same problem is a direct benefit of the feature of the redundancy and illustrates an advantage of this feature. As previously indicated, one such benefit is fault tolerance. A non-redundant structure can provide only one solution to the problem and virtually any fault in any atom would render such non-redundant structures unsuitable for the problem presented. On the other hand, the redundant structure of the present invention provides a number of different solutions to the same problem. For example, as indicated in FIG. 21, that network utilizes and upper atom which is transparent to the right leg input, a right-most second tier atom which is an AND gate configuration, a right-most third tier atom which is an exclusive OR configuration, and a middle third tier which is in a transparent left leg configuration. The remaining two atoms, namely, the left-most atoms of tiers 2 and 3 are in a "don't care" configuration. Thus, if an attempt was first made to provide a solution, as indicated in FIGS. 19, 20 and 22 and it was determined that a fault existed in the left-most atoms of the second and third tiers, or in their interconnections, restructuring of the atom functions by simply varying the control states as needed to present the solution of FIG. 21 would permit use of the network despite the faults noted. Similarly, if the right second tier atom of the network were stuck in the right leg transparent position, the solution of the network shown in FIG. 20 would still provide means for implementing the task assigned to the network by simply revising the control states of the various atoms. Those having skill in the relevant art will no doubt perceive of various other faults which could be tolerated as a result of the multiple solutions shown in FIGS. 19-22 or the additional solutions that they have deduced as a result of the teaching herein.

Multiple solutions to the same problem presented to the network also reveal an additional advantage of the redundancy feature of the present invention. More specifically, it will be observed that once the problem of the network has been defined, a network capable of multiple solutions may be given the task of determining its own solution based on a variety of selected criteria utilizing a truth table search routine with the simplest of feedback techniques. A typical criterion might be propagation speed through the network or another might be, overcoming a known fault in the network. Still another criterion might be the optimization of the probability of tolerating a fault in the future without the need for varying control states by minimizing dependency on those atoms or network interconnections which statistically have the highest probability of producing a fault in the field. Irrespective of the criterion used to select a solution to a problem, the capability of having multiple solutions from which to choose in order to provide the same Boolean logic function to a plurality of input variables, is novel.

Figure 23:
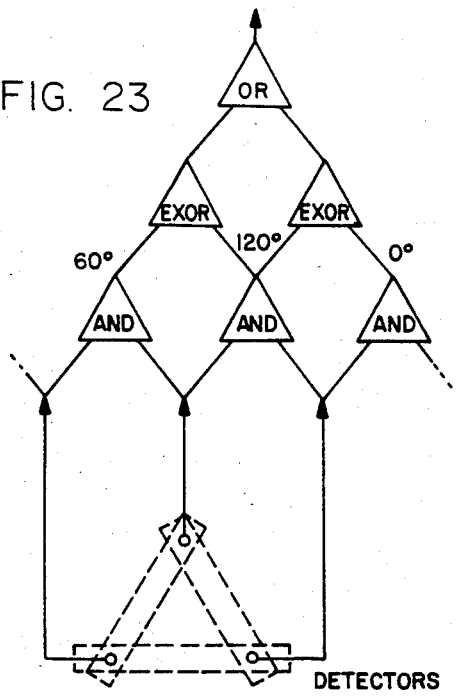

FIG. 23 is provided herein as an illustration of a solution which detects three lines presented to the same network. Those having skill in the relevant art will recognize this as one solution of many which carries out the task of providing a logical one only when any one of the three lines is detected.

Figure 24:
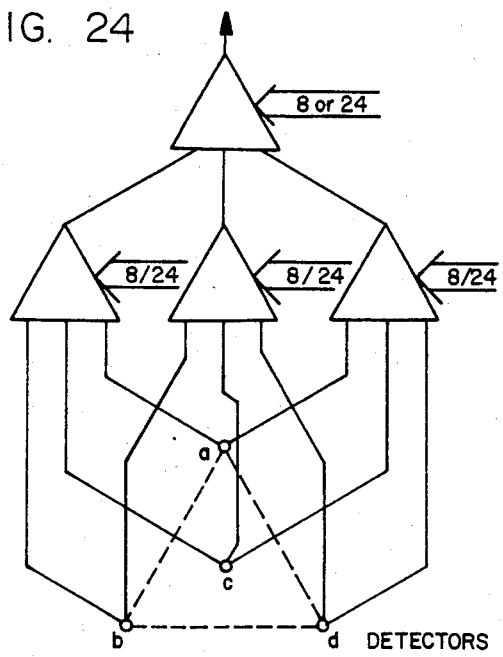
FIG. 24 is a block diagram of a four input configuration of the present invention illustrating its pattern recognition application.

It will now be recognized that the capabilities for carrying out the tasks discussed above in conjunction with FIGS. 17-23, represent a pattern recognition capability for the three input network configuration of the present invention where such recognition capability is dependent upon the input of three variables from a corresponding number of detectors. It will be understood that more complex pattern recognition functions can be performed by the present invention utilizing architectures configured for additional numbers of inputs. The first step in this increase in the number of inputs is represented in FIG. 24 where a pattern recognition application utilizing four detectors is illustrated. As seen in FIG. 24, two alternative levels of redundancy are indicated depending upon the selected number of control lines and configuration for each of the networks shown in that figure. It will now be understood that the level of redundancy determines the extent of fault tolerance and/or problem solving capability for adaptive networks. Clearly, larger, more complex networks with capabilities for five or more input variables and thus more complex pattern recognition applications, as well as other applications, are contemplated within the scope of the present invention.

It will now be understood that what has been disclosed herein comprises a logic device which provides a functionally redundant architecture with a substantially enhanced probability of functionality despite the presence of faults thus rendering the device more reliable in the field and more likely to provide greater production yields. Furthermore, functional redundancy renders the device suitable for use in adaptable problem solving machines where problems may be numeric such as mathematical calculations as well as non-numeric such as pattern recognition. A number of illustrative embodiments have been disclosed. In one such embodiment the logic structure comprises a combinational logic device in the form of a complete gate structure comprising a three input gate constructed from six two variable input gates. A number of additional embodiments are disclosed comprising three and four input variable networks, each of which is at least initially logically redundant and some of which are shown to undergo simplifications where atoms or nodes of a particular network are fixed or omitted whereby the total number of logical control options has been reduced.

The unique functional redundancy feature of the logical architectures of the present invention, including the specific embodiments shown herein, results in a logical device which can be manufactured in the form of VLSI chips an have the advantage of being programmable in the field, have increased production yields, greater reliability, be tolerant of faults, and have the potential of being an important building block for adaptive network systems. Numerous modifications and additions will now occur to those having relevant skill as a result of the teaching disclosed herein. By way of example, it will now be recognized that the advantageous feature of functional redundancy is not necessarily limited to logical networks which are complete. In fact the novel application of functional redundancy results in identical or similar advantages in incomplete networks where redundancy in such instances would have the same definition indicated above, namely, the number of control states divided by the number of functions being greater than 1. The only distinction is that the number of functions would not be determined analytically by merely addressing the number of input variables, but would depend upon the number of functions expected of the device, it being recognized beforehand that the device is not expected to be complete for the particular purpose for which it is utilized. In any case, such additions and modifications, including the concept of functional redundancy in incomplete logic networks, is contemplated as being within the scope of the present invention which is to be limited only by the claims appended hereto.

We claim:

1. A logic gate structure having a plurality of data input variables and comprising:
   a hierarchial array of multi-variable input gates, at least one such gate having a plurality of gate control input lines for selecting operation of said gate in accordance with any one of a plurality of possible Boolean logic functions for the number of data input variables; said gates comprising:
   a plurality of memory devices, at least one such memory device being associated respectively with each such gate and being connected to said gate control input lines for selecting said gate operation;
   register means being associated respectively with each such memory device for sequentially selecting the output of said memory devices for application to said gate control lines; and
   means for activating said register means for applying selected binary signals from said memory devices to said gates for presenting a selected Boolean logic function to said data input variables.

2. The logic gate structure recited in claim 1 wherein the number of control lines is greater than the mininum required to select all of the logic functions of said gate structure.

3. The logic gate structure recited in claim 1 wherein said structure is implemented in a VLSI integrated circuit chip.

4. The logic gate structure recited in claim 1 further comprising:
   means for selectively fixing all of said memory devices for respective application of constant output signals to said control lines for selecting any one of the possible Boolean logic functions for the number of variable signals input to said logic gate structure.

5. A three-variable logic gate structure comprising:
   a hierarchial array of six replicated two-variable input gates, at least one such gate having four control input lines for selecting operation of said gate in accordance with any one of a plurality of Boolean logic functions for two variable inputs; said gate comprising:
   a plurality of memory devices, at least one such memory device being associated respectively with each such gate and being connected to said gate control input lines for selecting said gate operation;
   register means being associated respectively with each such memory device for sequentially selecting the output of said memory devices for application to said gate control lines; and
   means for activating said register means for applying selected binary signals from said memory devices to said gates for presenting a selected Boolean logic function.

6. The logic gate structure recited in claim 5 wherein the total number of control input lines is more than 8 whereby all two hundred fifty six Boolean logic functions of three input variables may be selected by said activating means despite the presence of a fault in at least one of said gates.

7. The logic gate structure recited in claim 5 wherein the number of control lines is greater than the minimum required to select all of the logic functions of said gate structure.

8. The logic gate structure recited in claim 5 wherein said structure is implemented in a VLSI integrated circuit chip.

9. The logic gate structure recited in claim 5 further comprising:
   means for selectively fixing all of said memory devices for respective application of constant output signals to said control lines for selecting any one of the possible Boolean logic functions for the number of variable signals input to said logic gate structure.

10. A logical gate structure having a minimum of three input variables and comprising:
    a plurality of interconnected replicated gates, at least one such gate having a plurality of directly accessible control input lines for selecting a logic function in accordance with any one of a plurality of possible Boolean logic functions for the number of variables input to the gate; said gate comprising:
    means for generating signals to be applied to each gate on said control lines for limiting logic operation in accordance with a selected function for each said gate; and
    control means connected to said generating means for applying generated signals to each said gate in a predetermined combination for presenting a selected Boolean logic function to said gate structure input variables, the number of Boolean logic functions of said gate structure being equal to the maximum number possible for the number of input variables.

11. The logic gate structure recited in claim 10 wherein the total number of control input lines is greater than 2 raised exponentially to the number of input variables whereby all possible Boolean logic functions of the number of input variables may be selected by said control means despite the presence of a fault in at least one of said gates.

12. The logic gate structure recited in claim 10 wherein the number of gates and control input lines is sufficient to render said gate structure logically redundant.

13. The logic gate structure recited in claim 10 wherein said structure is implemented in a VLSI integrated chip.

14. The logic gate structure recited in claim 10 further comprising:
    means for selectively fixing said generating means for respective application of constant output signals to said control lines for selecting any one of the possible Boolean logic functions for the number of variable signals input to said logic gate structure.

15. A functionally redundant and complete logic gate structure having a plurality of input data lines and at least one output data line and comprising a plurality of interconnected gates, at least one of said gates having as inputs a plurality of control lines for selecting one of a plurality of possible logic function states of said gate in accordance with the selected combination of signal states of said control lines, the total number of said control line signal state combinations of all of said gates in said structure being greater than the number of Boolean logic functions of said gate structure, the number of Boolean logic functions of said gate structure being equal to the maximum number possible for the number of data lines input to said gate structure.

16. The logic gate structure recited in claim 15 wherein said gates are interconnected in a hierarchial array.

17. The logic gate structure recited in claim 15 wherein at least one of said gates has a fixed unitary function.

18. A functionally redundant and complete logic gate structure having a plurality of unit data lines and at least one output data line and comprising six gates, at least two of said gates having four control lines each for selecting any one of at least 256 Boolean logic functions for said gate structure, the total number of said control line signal state combinations of all of said gates in said structure being greater than the number of Boolean logic functions of said gate structure.

19. A functionally redundant and complete logic gate structure having a plurality of input data lines and at least one output data line and comprising 24 gates, at least eight of said gates having four control lines each for selecting any one of at least 65,536 Boolean logic functions for said gate structure, the total number of said control line signal state combinations of all of said gates in said structure being greater than the number of Boolean logic functions of said gate structure.

* * * * *